(12) United States Patent
Yin et al.

(10) Patent No.: US 9,548,317 B2
(45) Date of Patent: Jan. 17, 2017

(54) FDSOI SEMICONDUCTOR STRUCTURE AND METHOD FOR MANUFACTURING THE SAME

(75) Inventors: Haizhou Yin, Poughkeepsie, NY (US); Huilong Zhu, Poughkeepsie, NY (US); Zhijiong Luo, Poughkeepsie, NY (US)

(73) Assignee: Institute of Microelectronics, Chinese Academy of Sciences, Beijing (CN)

( * ) Notice: Subject to any disclaimer, the term of this patent is extended or adjusted under 35 U.S.C. 154(b) by 51 days.

(21) Appl. No.: 14/397,586

(22) PCT Filed: May 22, 2012

(86) PCT No.: PCT/CN2012/075913
§ 371 (c)(1),
(2), (4) Date: Oct. 28, 2014

(87) PCT Pub. No.: WO2013/159416
PCT Pub. Date: Oct. 31, 2013

(65) Prior Publication Data
US 2015/0145046 A1 May 28, 2015

(30) Foreign Application Priority Data

Apr. 28, 2012 (CN) .......................... 2012 1 0134597

(51) Int. Cl.
*H01L 21/84* (2006.01)
*H01L 27/12* (2006.01)
(Continued)

(52) U.S. Cl.
CPC ..... *H01L 27/1203* (2013.01); *H01L 21/02529* (2013.01); *H01L 21/02532* (2013.01);
(Continued)

(58) Field of Classification Search
CPC .......... H01L 21/76897; H01L 27/1203; H01L 21/02529; H01L 21/02532; H01L 21/2652; H01L 21/266; H01L 21/30604; H01L 21/3081; H01L 21/743; H01L 21/84; H01L 29/165; H01L 29/66636; H01L 29/66659
See application file for complete search history.

(56) References Cited

U.S. PATENT DOCUMENTS

| 6,689,671 B1 * | 2/2004 | Yu ..................... H01L 21/02381 257/E21.129 |
| 2003/0054594 A1 * | 3/2003 | Yoshida ............ H01L 21/76264 438/154 |

(Continued)

FOREIGN PATENT DOCUMENTS

| CN | 1409387 A | 4/2003 |
| CN | 1487597 A | 4/2004 |

(Continued)

OTHER PUBLICATIONS

International Search Report for corresponding International Application No. PCT/CN2012/075913, mailed Feb. 7, 2013 (8 pages).

(Continued)

*Primary Examiner* — Duy T Nguyen
(74) *Attorney, Agent, or Firm* — Osha Liang LLP

(57) ABSTRACT

The present invention provides a method for manufacturing a semiconductor structure, which comprises following steps: providing a substrate, which comprises upwards in order a base layer, a buried isolation layer, a buried ground layer, an ultra-thin insulating buried layer and a surface active layer; implementing ion implantation doping to the buried ground layer; forming a gate stack, sidewall spacers and source/drain regions on the substrate; forming a mask layer on the substrate that covers the gate stack and the source/drain regions, and etching the mask layer to expose the source region; etching the source region and the ultra-thin insulating buried layer under the source region to form an opening (Continued)

that exposes the buried ground layer; filling the opening through epitaxial process to form a contact plug for the buried ground layer. Accordingly, the present invention further provides a semiconductor structure. The present invention proposes formation of a buried ground layer contact plug, which then connects buried ground layer electrically to source region, thereby enhancing control capabilities of a semiconductor device over threshold voltages, suppressing short-channel effects and improving device performance; whereas no independent contact is required to build for the buried ground layer, which then saves device area and simplifies manufacturing process accordingly.

8 Claims, 7 Drawing Sheets

(51) Int. Cl.
| | | |
|---|---|---|
| *H01L 29/66* | (2006.01) | |
| *H01L 29/786* | (2006.01) | |
| *H01L 21/02* | (2006.01) | |
| *H01L 21/266* | (2006.01) | |
| *H01L 21/306* | (2006.01) | |
| *H01L 21/308* | (2006.01) | |
| *H01L 21/768* | (2006.01) | |
| *H01L 29/78* | (2006.01) | |
| *H01L 21/74* | (2006.01) | |
| *H01L 21/265* | (2006.01) | |
| *H01L 29/165* | (2006.01) | |

(52) U.S. Cl.
CPC ........ *H01L 21/266* (2013.01); *H01L 21/2652* (2013.01); *H01L 21/3081* (2013.01); *H01L 21/30604* (2013.01); *H01L 21/743* (2013.01); *H01L 21/76897* (2013.01); *H01L 21/84* (2013.01); *H01L 29/165* (2013.01); *H01L 29/66636* (2013.01); *H01L 29/66659* (2013.01); *H01L 29/66772* (2013.01); *H01L 29/78* (2013.01); *H01L 29/78612* (2013.01); *H01L 29/78648* (2013.01)

(56) References Cited

U.S. PATENT DOCUMENTS

| | | | | |
|---|---|---|---|---|
| 2004/0046208 A1* | 3/2004 | Dennard | ........... | H01L 21/76264 257/347 |
| 2006/0084235 A1* | 4/2006 | Barr | ................... | H01L 29/66636 438/300 |
| 2012/0112208 A1* | 5/2012 | Adam | ............... | H01L 21/28525 257/77 |

FOREIGN PATENT DOCUMENTS

| | | |
|---|---|---|
| CN | 102214690 A | 10/2011 |
| CN | 102299074 A | 12/2011 |

OTHER PUBLICATIONS

Written Opinion for corresponding International Application No. PCT/CN2012/075913, mailed Feb. 7, 2013 (5 pages).

* cited by examiner

FDSOI SEMICONDUCTOR STRUCTURE AND METHOD FOR MANUFACTURING THE SAME

CROSS-REFERENCE TO RELATED APPLICATIONS

The present application is a national stage application of PCT/CN2012/075913, filed on May 22, 2012, which claims priority to Chinese Application No. 201210134597.X, filed on Apr. 28, 2012. The priority applications are hereby incorporated by reference in their entirety.

FIELD OF THE INVENTION

The present invention relates to semiconductor manufacturing field, particularly, to a semiconductor structure and a method for manufacturing the same.

BACKGROUND OF THE INVENTION

In order to improve both performance and integrity of integrated circuit chips, feature sizes of devices are scaled down continually in view of Moore's law, which nowadays have already reached into the nanometer regime. Traditional planar bulky Si CMOS technology cannot any more boost improvement in device performance and decrease power consumption at the meantime of improving integrity of circuits. Consequently, device parameters fluctuate randomly and the threshold voltage cannot be scaled down proportionally, which further brings limits on enhancement of whole device performance. In technology node of 45 nm and below, dramatically soaring short-channel effects also raise difficulties of further scaling down devices proportionally.

Fully depleted SOI (FDSOI) devices, which exhibit outstanding suppression of short-channel effects, excellent sub-threshold properties, small leakage currents and slight influence of random doping fluctuations, are regarded as preferred structures for replacing traditional bulky Si devices at technology node of 32 nm and below. FDSOI devices are usually configured with an ultra-thin (≤50 nm) SOI structure, thus decrease in thickness (≤50 nm) of buried oxide layer (BOX) can further improve device performance, lessen influences arising from self-heating effects, peripheral fields and the like. Besides, owing to introduction of a ground layer into the back face of ultra-thin BOX layer so as to enhance controls and regulations of back gates, such Ultra-Thin Body and BOX (UTBB) SOI devices are able to reduce electric fields coupling at source/drain regions and to increase controls of threshold voltages, such that they exhibit broad prospects of being utilized in applications of low power consumption. However, circuit area has been increased inevitably due to introduction of back gate contact and relevant wiring, thereby increasing manufacturing cost. Therefore, for UTBB SOI devices, how to find a balance between optimal device performance and costs has now become a critical problem that is waiting for a solution.

SUMMARY OF THE INVENTION

The present invention is intended to at least resolve aforementioned problems; and the present invention provides a semiconductor structure and a method for manufacturing the same, in which a buried ground layer is electrically connected to source region, thus it is not necessary to build up an independent contact for the buried ground layer, thereby saving device area.

In order to fulfill aforementioned objects, the present invention provides a method for manufacturing a semiconductor structure, which comprises following steps:

(a) providing a substrate, which comprises upwards in order a base layer, a buried isolation layer, a buried ground layer, an ultra-thin insulating buried layer and a surface active layer;

(b) performing ion implantation doping to the buried ground layer;

(c) forming a gate stack, sidewall spacers and source/drain regions on the substrate;

(d) forming a mask layer on the substrate that covers the gate stack and source/drain regions, and etching the mask layer to expose the source region;

(e) etching the source region and the ultra-thin insulating buried layer under the source region to form an opening that exposes the buried ground layer;

(f) filling the opening through epitaxial process to form a contact plug for the buried ground layer.

In another aspect, the present invention further provides a semiconductor structure, which comprises a substrate, a gate stack, sidewall spacers, a source region, a drain region and a buried ground layer contact plug, wherein:

the substrate comprises upwards in order a base layer, a buried isolation layer, a buried ground layer, an ultra-thin insulating buried layer and a surface active layer;

The gate stack is located on the surface active layer of the substrate;

The sidewall spacers are located on sidewalls of the gate stack;

The source region and the drain region are located on both sides of the gate stack and are embedded into the surface active layer of the substrate;

the buried ground layer contact plug, which is in contact with the source region, is located on one side of the source region that is far away from the gate stack, and penetrates through the surface active layer and the ultra-thin insulating buried layer of the substrate till comes into contact with the buried ground layer.

As compared to the prior art, the present invention exhibits following advantages:

Owing to formation of a buried ground layer contact plug, the buried ground layer is electrically connected to the source region, which thence enhances control capabilities of semiconductor devices over threshold voltages, suppresses short-channel effects and improves device performance; whereas no independent contact is required to build for the buried ground layer, which thence saves device area and simplifies manufacturing process accordingly.

BRIEF DESCRIPTION OF THE DRAWINGS

Aforementioned and/or additional aspects and advantages of the present invention are made more evident according to perusal of the following detailed description of exemplary embodiment(s) in conjunction with accompanying drawings; wherein.

DETAILED DESCRIPTION OF THE INVENTION

Figure 1:
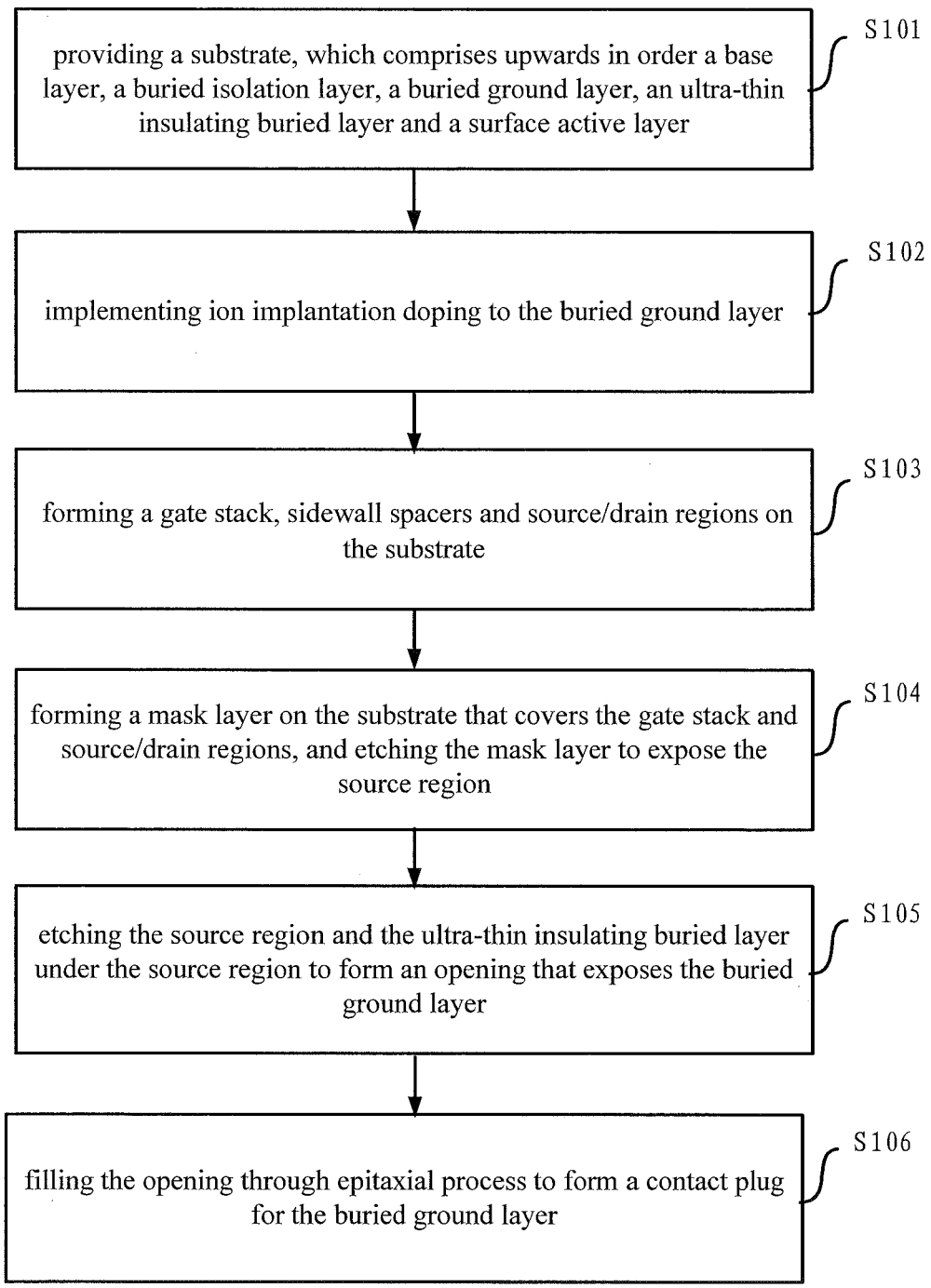
FIG. 1 illustrates a diagram of an embodiment of a method for manufacturing a semiconductor structure according to the present invention.

Embodiments of the present invention are described at length below, wherein examples of the embodiments are illustrated in the drawings, in which same or similar reference signs throughout denote same or similar elements or elements have same or similar functions. It should be appreciated that embodiments described below in conjunction with the drawings are illustrative, and are provided for explaining the prevent invention only, thus shall not be interpreted as a limit to the present invention. Various embodiments or examples are provided here below to implement different structures of the present invention. To simplify the disclosure of the present invention, descriptions of components and arrangements of specific examples are given below. Of course, they are only illustrative and not limiting the present invention. Moreover, in the present invention, reference numbers and/or letters may be repeated in different examples. Such repetition is for purposes of simplicity and clarity, yet does not denote any relationship between respective embodiments and/or arrangements under discussion. Furthermore, the present invention provides various examples for various processes and materials. However, it is obvious for a person of ordinary skill in the art that other processes and/or materials may be alternatively utilized. In addition, following structures where a first feature is "on/above" a second feature may include an embodiment in which the first feature and the second feature are formed to be in direct contact with each other, and may also include an embodiment in which another feature is formed between the first feature and the second feature such that the first and second features might not be in direct contact with each other.

FIG. 1 illustrates a diagram of a method for manufacturing a semiconductor structure provided by the present invention; FIG. 2 to FIG. 12 illustrate respectively cross-sectional views of a semiconductor structure manufactured according to the method for manufacturing a semiconductor structure as illustrated in FIG. 1. Here below, the method for manufacturing a semiconductor structure is described at length in conjunction with FIG. 2 to FIG. 12. However, it is noteworthy that the respective figures for embodiments of the present invention are provided for purposes of illustration, thus are not necessarily drawn to scale.

Figure 2:
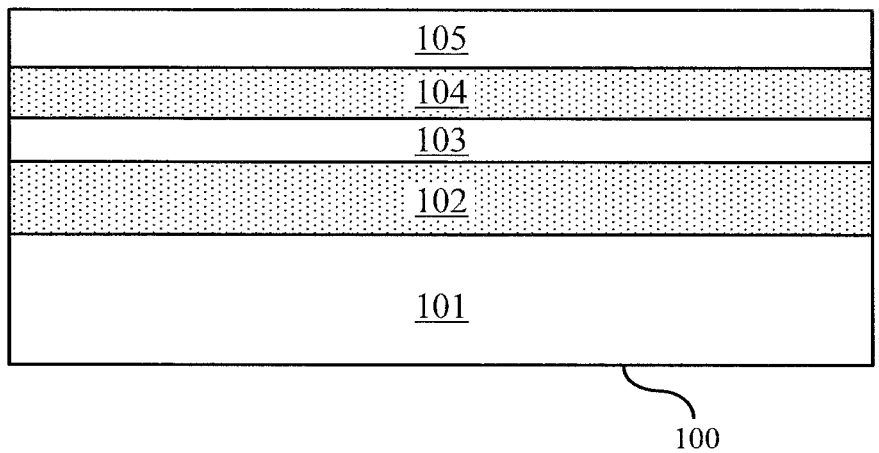
FIG. 2 to FIG. 12 illustrate respectively cross-sectional views of a semiconductor structure manufactured according to the method for manufacturing a semiconductor structure as illustrated by FIG. 1.

With reference to FIG. 1 and FIG. 2, at step S101, a substrate 100 is provided, wherein the substrate 100 comprises upwards in order a base layer 101, a buried isolation layer 102, a buried ground layer 103, an ultra-thin insulating buried layer 104 and a surface active layer 105.

The substrate used in the present invention is an Ultra-Thin Body and BOX (UTBB) SOI structure. The base layer 101 provides mechanical support for layers located above it. In the present embodiment, the base layer 101 is monocrystalline Si. In other embodiments, the base layer 101 may further comprise other basic semiconductor, such as germanium, or other compound semiconductors, for example, SiC, GaAs, InAs or InP. Typically, the thickness of the base layer 101 may be, but is not limited to, approximately several hundred micrometers, for example, in the range of 0.1 mm-1 mm.

The buried isolation layer 102 and the ultra-thin insulating buried layer 104 may be made of $SiO_2$, $Si_3N_4$, $Al_2O_3$ or any other insulating material as appropriate. Typically, the thickness of the buried isolation layer 102 may be in the range of 50 nm-300 nm, and the thickness of the ultra-thin insulating buried layer 104 may be in the range of 5 nm-50 nm.

The materials of the buried ground layer 103 and the surface active layer 105 may be Si, Ge, or other compound semiconductors, for example, SiC, GaAs, InAs or InP. The thickness of the buried ground layer 103 may be 5 nm-30 nm, and the thickness of the surface active layer 105 may be 5 nm-50 nm.

Figure 3:
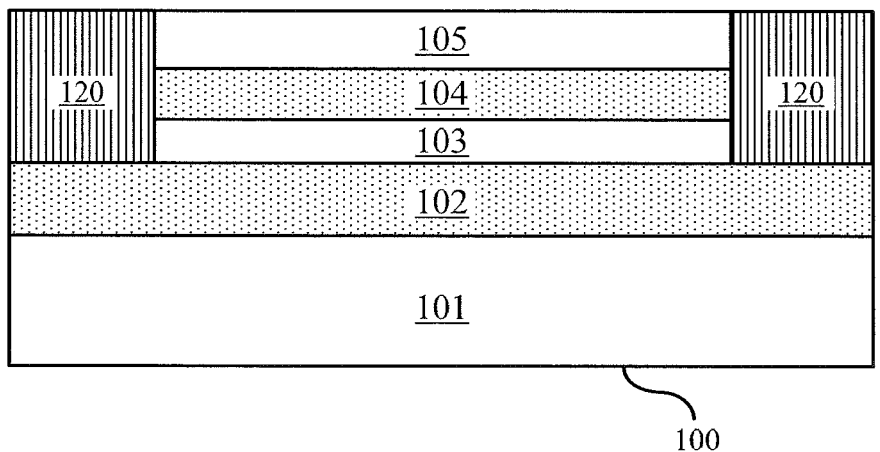

Particularly, step S101 is further comprised of forming an isolation region in the substrate 100, for example, a shallow trench isolation (STI) structure 120, so as to electrically isolate consecutive semiconductor devices. As shown in FIG. 3, the shallow trench isolation (STI) structure 120 penetrates through the surface active layer 105, the ultra-thin insulating buried layer 104 and the buried ground layer 103 to be in contact with the buried isolation layer 102.

Figure 4:
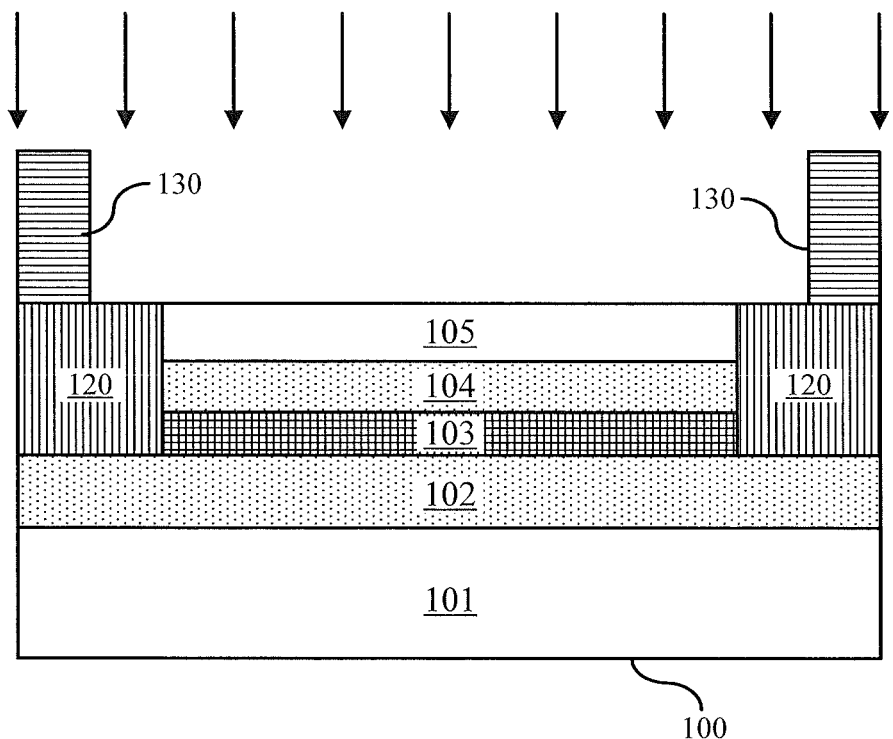

With reference to FIG. 1 and FIG. 4, step S102 is implemented to perform ion implantation doping to the buried ground layer 103. Specifically, the substrate is overlaid with a layer of photoresist 130, and then the photoresist experiences processes of exposure and development. Then, ion implantation is performed with the photoresist 130 functioning as a mask. Parameters like energy, voltage and dose of ion implantation are regulated such that peak concentration reaches in the buried ground layer 103, yet does not cause any damage to the surface active layer 105 at the meantime. Next, annealing is performed to produce a heavily doped buried ground layer 103. The doping concentration of the buried ground layer 103 may be subjected to requirements of threshold voltages of devices and may vary in the range of $10^{18}$-$10^{20}$ cm$^{-3}$; the buried ground layer is N-type doped for NMOS and P-type doped for PMOS.

Next, step S103 is implemented to form a gate stack, sidewall spacers 230, a drain region 310 and a source region 320 on the substrate 100.

Figure 5:
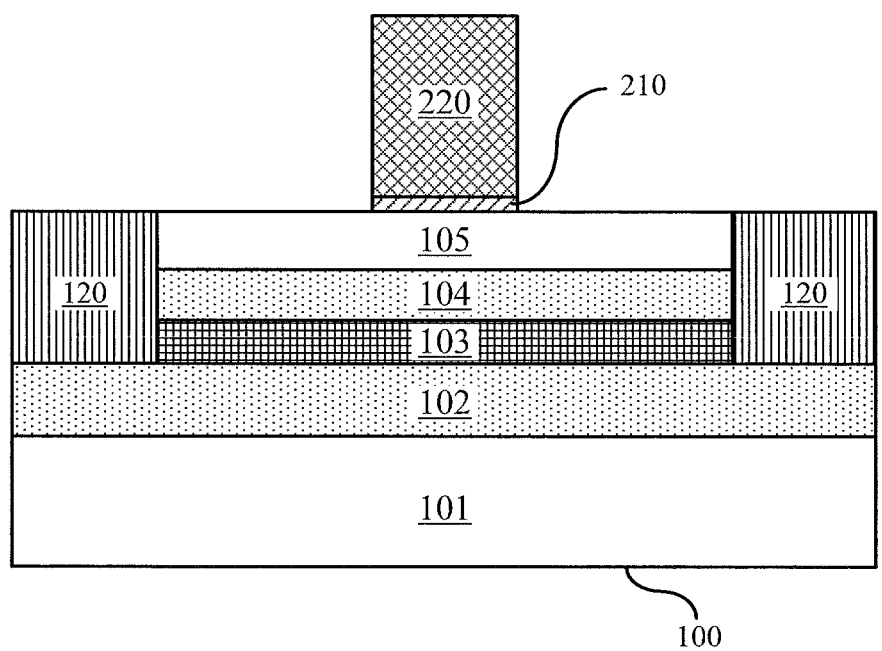

Firstly, as shown in FIG. 5, a gate stack is formed on the substrate, wherein the gate stack comprises a gate dielectric layer 210 and a gate 220. Optionally, the gate stack may further comprise a cap layer (not shown) that covers the gate and is formed through depositing $Si_3N_4$, $SiO_2$, $SiO_xN_y$, SiC or combinations thereof, for purposes of protecting the head region of the gate 220 and preventing the same from damage arising from subsequent processes. The gate dielectric layer 210 is located on the surface active layer 105 of the substrate 100, and may be made of a High-K dielectric, for example, any one selected from a group consisting of $HfO_2$, HfSiO, HfSiON, HfTaO, HfTiO, HfZrO, $Al_2O_3$, $La_2O_3$, $ZrO_2$, LaAlO or combinations thereof. In another embodiment, the gate dielectric layer 210 may further be a thermal oxide layer, comprising $SiO_2$ or $SiO_xN_y$; the thickness of the gate dielectric layer 210 may be 1 nm-10 nm, for example, 5 nm or 8 nm. Then, the gate 220 is formed on the gate dielectric layer 210; wherein the gate 220 may be heavily doped poly Si formed through deposition, or, may be formed through forming a work function metal layer firstly (for NMOS, which is TaC, TiN, TaTbN, TaErN, TaYbN, TaSiN, HfSiN, MoSiN, RuTa$_x$, NiTa$_x$, etc; for PMOS, which is MoN$_x$, TiSiN, TiCN, TaAlC, TiAlN, TaN, PtSi$_x$, Ni$_3$Si, Pt, Ru, Ir, Mo, HfRu, RuO$_x$), whose thickness may be 1 nm-20 nm, for example, 3 nm, 5 nm, 8 nm, 10 nm, 12 nm or 15 nm; then, the gate 220 is formed through forming a heavily doped poly Si, Ti, Co, Ni, Al, W or alloy thereof onto the work function metal layer.

In some other embodiments of the present invention, Gate Last process may be used as well; in this case, the gate stack comprises a gate 220 (which is a dummy gate in this case) and a gate dielectric layer 210 for carrying said gate. The gate 220 (which is a dummy gate in this case) is formed on the gate dielectric layer 210 through depositing, for example, poly Si, poly SiGe, amorphous Si, doped or undoped $SiO_2$, $Si_3N_4$, $SiO_xN_y$, SiC and even a metal; the thickness of the gate 220 may be 10 nm-80 nm. Optionally, aforesaid process may further comprise forming a cap layer on the gate 220 (which is a dummy gate in this case) through depositing $Si_3N_4$, $SiO_2$, $SiO_xN_y$, SiC or combinations thereof, for purposes of protecting the head region of the dummy gate 220 and preventing the head region of the gate 220 (which is a dummy gate in this case) from reacting with metal layers deposited for formation of contact layers in subsequent steps. In another embodiment of Gate Last process, a gate stack may be formed without a gate dielectric layer 210 at first; instead, at the subsequent processing steps, a gate dielectric layer 210 may be formed after removal of the dummy gate yet prior to filling the work function metal layer.

Figure 6:
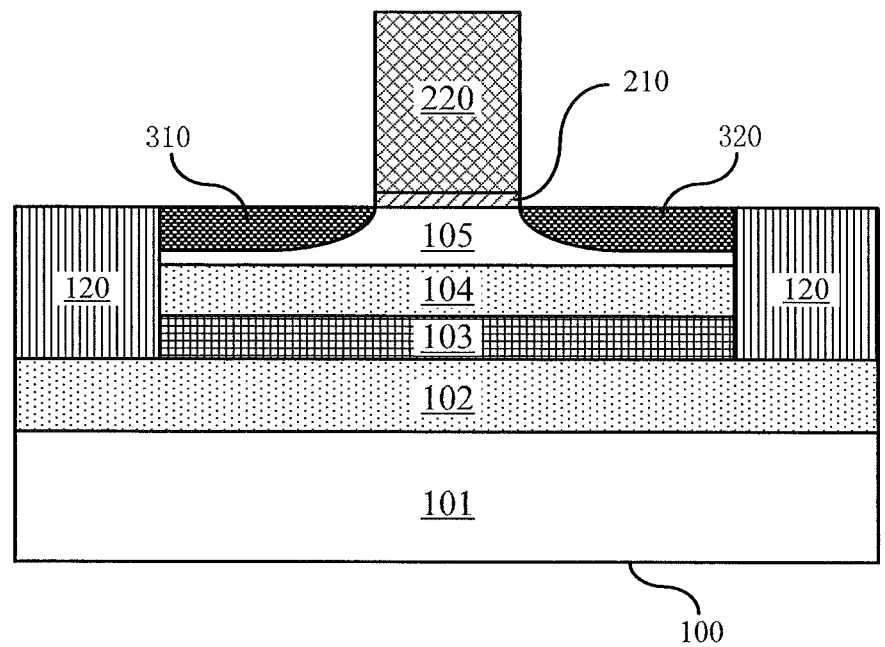

Next, as shown in FIG. 6, dopants of P-type or N-type are implanted into the surface active layer 105 with the gate stack functioning as a mask, so as to form the drain region 310 and the source region 320 on both sides of the gate stack. The drain region 310 and the source region 320 may be P-type doped Si for PMOS and N-type doped Si for NMOS. Then, the semiconductor structure experiences annealing so as to activate dopants in the drain region 310 and the source region 320; wherein annealing may be performed through rapid annealing, spike annealing or any other method as appropriate. Optionally, the drain region 310 and the source region 320 may be formed after formation of the sidewall spacers 230; after formation of the gate stack, source/drain extension regions (not shown) may be formed through low-energy implantation.

Figure 7:
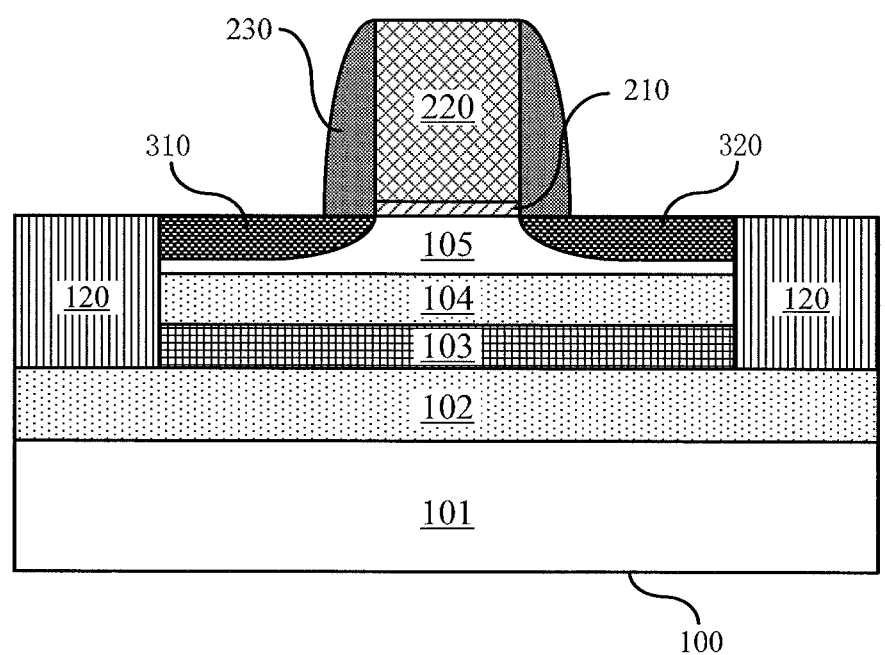

As shown in FIG. 7, sidewall spacers 230 are formed on sidewalls of the gate stack for isolating the gate stack. The sidewall spacers 230 may be made of a material selected from a group consisting of $Si_3N_4$, $SiO_2$, $SiO_xN_y$ and SiC or combinations thereof, and/or other materials as appropriate. The sidewall spacers 230 may be in a multi-layer structure. The sidewall spacers 230 may be formed through deposition-etching process, and the thickness thereof may be in the range of 10 nm-100 nm, for example, 30 nm, 50 nm or 80 nm.

Figure 8:
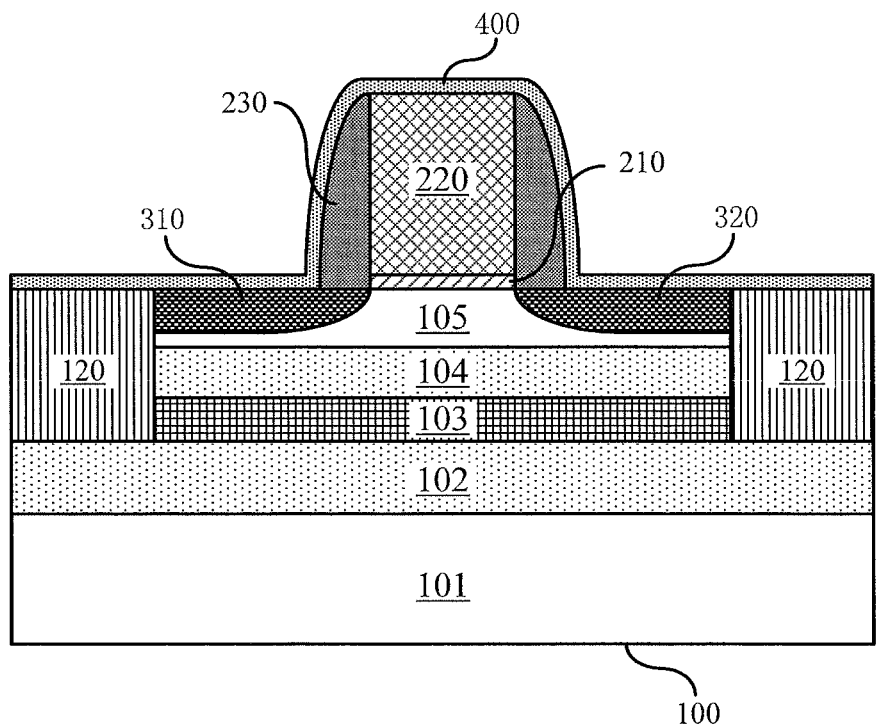
Figure 9:
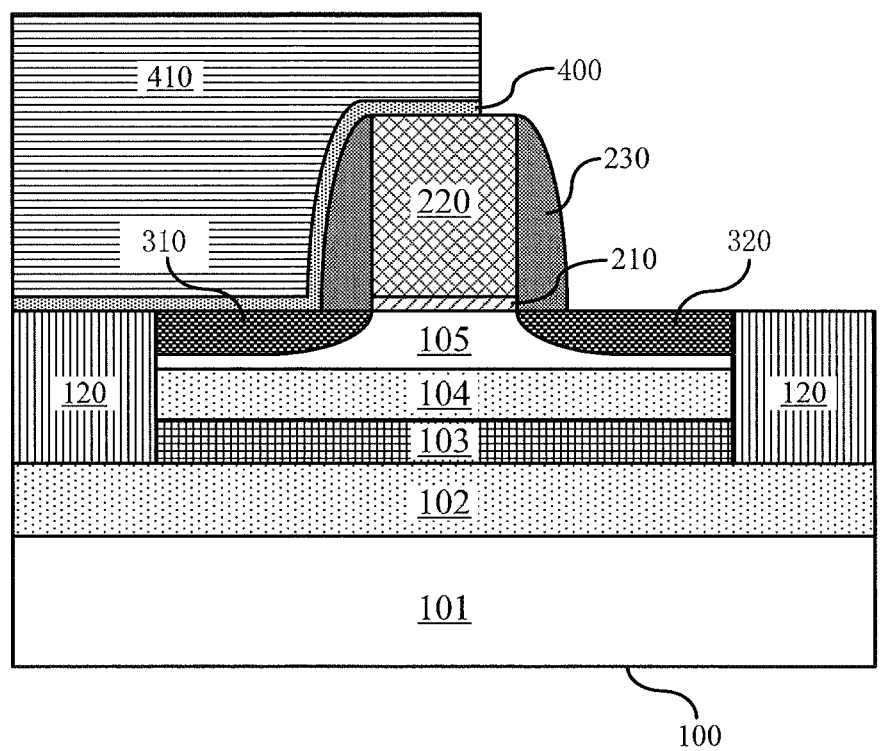

With reference to FIG. 8 and FIG. 9, step S104 is implemented to form a mask layer 400 on the substrate 100 that covers the gate stack and source/drain regions; then the mask layer 400 is etched to expose the source region 320. As shown in FIG. 8, the mask layer 400 may be made of a material selected from a group consisting of $SiO_2$, $Si_3N_4$ and $SiO_xN_y$, and formed on the substrate through chemical vapor deposition, sputtering or any other method as appropriate. Then, as shown in FIG. 9, a layer of photoresist 410 overlying the mask layer 400 is formed firstly, then the photoresist 410 is patterned by means of exposure and development, and then the mask layer 400 is etched to expose the source region 320.

Figure 10:
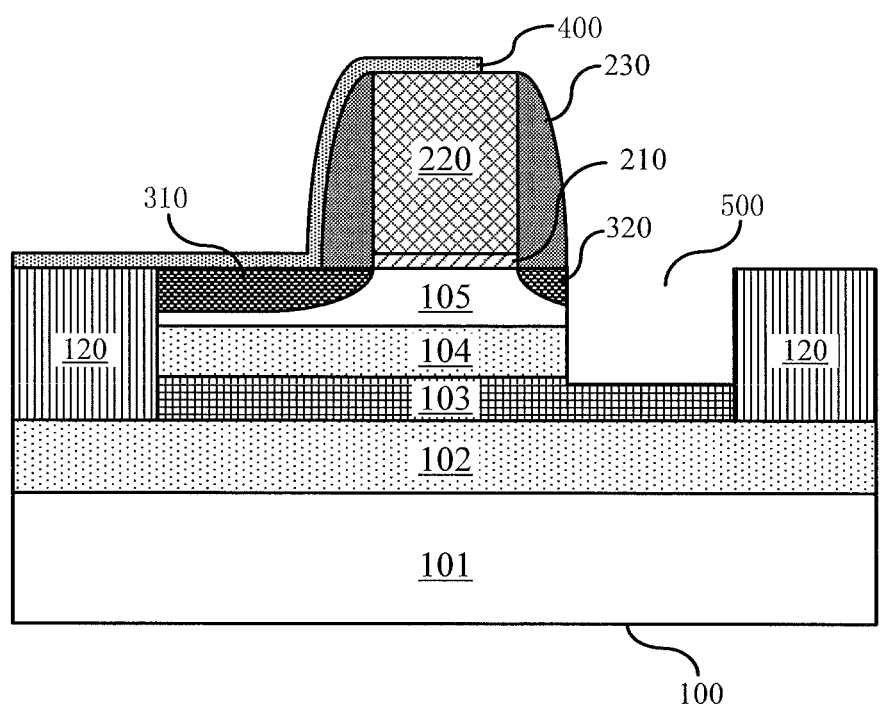

With reference to FIG. 10, step S105 is implemented to etch the source region 320 and the ultra-thin insulating buried layer 104 under the source region 320, so as to form an opening 500 that exposes the buried ground layer 103; then the photoresist 410 is removed. Specifically, dry etching RIE or wet etching is applied to etch the source region 320 and the ultra-thin insulating buried layer 104 individually so as to form the opening 500.

Figure 11:
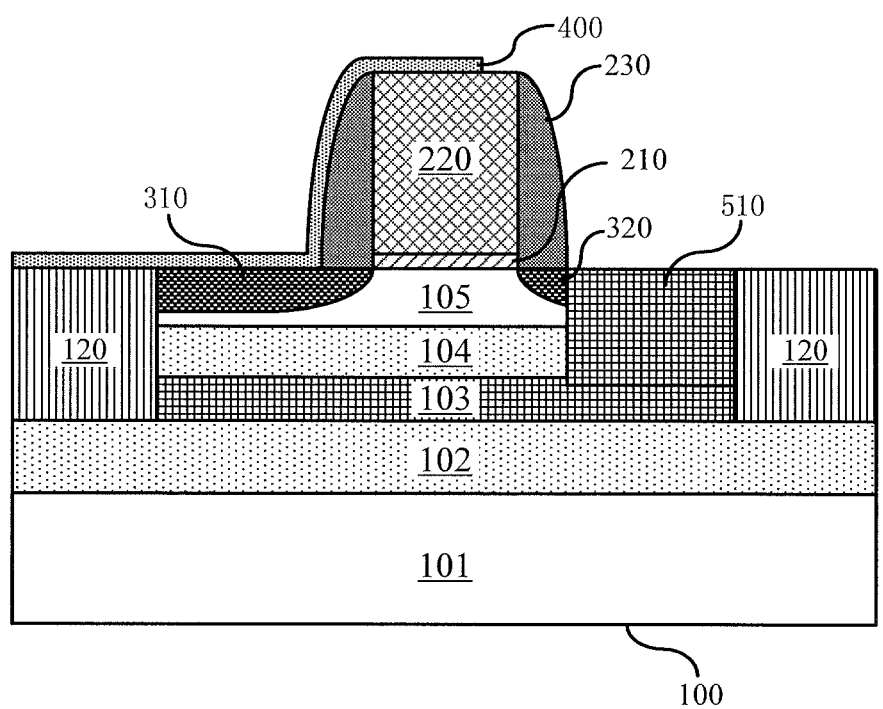
Figure 12:
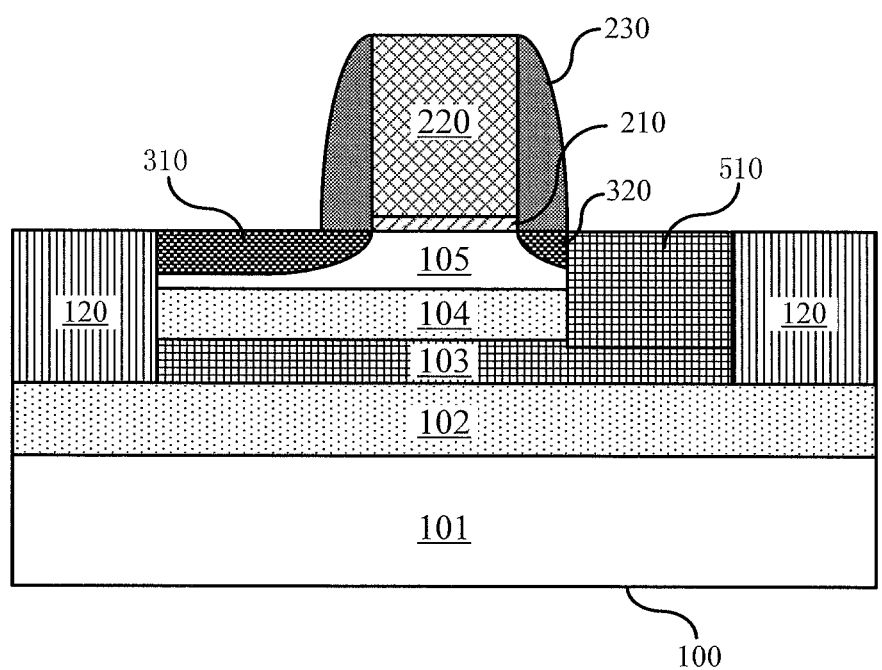

Next, with reference to FIG. 11 and FIG. 12, step S106 is implemented to fill the opening 500 through epitaxial process, so as to form a contact plug 510 for the buried ground layer 103. Epitaxial growing is performed with the buried ground layer 103 under the opening 500 functioning as a seed crystal layer, so as to form the contact plug 510. The material of the contact plug 510 of the buried ground layer may be Si, Ge, SiGe or SiC. Step S106 further comprises doping the buried ground layer contact plug 510 by means of, including, in-situ doping during the epitaxial process or ion implantation. The doping concentration of the buried ground layer contact plug is $10^{18}$-$10^{20}$ cm-3, whose doping type is same as that of the buried ground layer 103 and the source region 320. The buried ground layer contact plug is N-type doped for NMOS and P-type doped for PMOS. FIG. 12 illustrates a cross-sectional view of a semiconductor structure after its mask layer 400 has been removed; it is evident therefrom that the buried ground layer contact plug 510 is in contact with the source region 320, and is located on one side of the source region 320 that is far away from the gate stack, and penetrates through the surface active layer 105 and the ultra-thin insulating buried layer 104 to be in contact with the buried ground layer 103.

The manufacturing of the semiconductor structure is completed according to steps of conventional process for manufacturing semiconductors; for example, forming a metal silicide on the source/drain regions; depositing an interlayer dielectric layer to cover the source/drain regions and the gate stack; etching the interlayer dielectric layer to expose the source/drain regions so as to form contact vias; filling the contact vias with metal; and forming multiple metal interconnecting layers in subsequent processes and steps. Alternatively, in a Gate Replacement process, steps like removing a dummy gate to form a metal gate may be implemented as well.

The present invention further provides a semiconductor structure, which comprises a substrate 100, a gate stack, sidewall spacers 230, a drain region 310, a source region 320 and a buried ground layer contact plug 510, as shown in FIG. 12. Wherein, the SOI substrate 100 comprises upwards in order a base layer 101, a buried isolation layer 102, a buried ground layer 103, an ultra-thin insulating buried layer 104 and a surface active layer 105, and the substrate is an Ultra-Thin Body and BOX (UTBB) SOI structure. The gate stack is located on the surface active layer 105 of the substrate 100; the sidewall spacers 230 are located on sidewalls of the gate stack; the source region 320 and the drain region 310 are located on both sides of the gate stack and are embedded into the surface active layer 105 of the substrate 100; the buried ground layer contact plug 510, which is in contact with the source region 320, is located on one side of the source region 320 that is far away from the gate stack, and penetrates through the surface active layer 105 and the ultra-thin insulating buried layer 104 of the substrate 100 to be in contact with the buried ground layer 103. The thickness of the buried ground layer 103 may be 5 nm-30 nm, the thickness of the ultra-thin insulating buried layer 104 may be 5 nm-50 nm, and the thickness of the surface active layer 105 may be 5 nm-50 nm. The buried ground layer 103, the buried ground layer contact plug 510 and the source region 320 have the same doping type. For NMOS, the doping type thereof is N-type; for PMOS, the doping type thereof is P-type. The materials of the buried ground layer contact plug 510 may be Si, Ge, SiGe or SiC. Stress at channel regions of the semiconductor structure may be further regulated through selecting a material as appropriate, whereby further improving driving competence of electric currents. The buried ground layer 103, which functions as a back gate therein, performs excellent controls to threshold voltages of the semiconductor structure, and further enhances device performance. Additionally, the buried ground layer 103 is electrically connected to the source region 320 via the buried ground layer contact plug 510, such that the electric potential of the buried ground layer 103 is maintained as constant as possible; accordingly, it is not necessary to build an independent contact and wiring for the buried ground layer 103, therefore, device area and manufacturing cost are saved accordingly.

Although the exemplary embodiments and their advantages have been described at length herein, it should be understood that various alternations, substitutions and modifications may be made to the embodiments without departing from the spirit of the present invention and the scope as defined by the appended claims. As for other examples, it may be easily appreciated by a person of ordinary skill in the art that the order of the process steps may be changed without departing from the scope of the present invention.

In addition, the scope, to which the present invention is applied, is not limited to the process, mechanism, manufacture, material composition, means, methods and steps described in the specific embodiments in the specification. According to the disclosure of the present invention, a person of ordinary skill in the art should readily appreciate from the disclosure of the present invention that the process, mechanism, manufacture, material composition, means, methods and steps currently existing or to be developed in future, which perform substantially the same functions or achieve substantially the same as that in the corresponding embodiments described in the present invention, may be applied according to the present invention. Therefore, it is intended that the scope of the appended claims of the present invention includes these process, mechanism, manufacture, material composition, means, methods or steps.

What that is claimed is:

1. A method for manufacturing a semiconductor structure, comprising:
    (a) providing a substrate, which comprises, from bottom to top, a base layer, a buried isolation layer, a buried ground layer, an ultra-thin insulating buried layer and a surface active layer;
    (b) implementing ion implantation doping to the buried ground layer;
    (c) forming a gate stack, sidewall spacers and source/drain regions on the substrate;
    (d) forming a mask layer on the substrate to cover the gate stack and source/drain regions, and etching the mask layer to expose the source region;
    (e) etching the source region and the ultra-thin insulating buried layer under the source region to form an opening that exposes the buried ground layer; and
    (f) filling the opening by an epitaxial process to form a contact plug for the buried ground layer.

2. The method of claim 1, wherein at step (a), the thickness of the buried ground layer is 5 nm-30 nm, the thickness of the ultra-thin insulating buried layer is 5 nm-50 nm, and the thickness of the surface active layer is 5 nm-50 nm.

3. The method of claim 1, wherein at step (b), the doping concentration of the buried ground layer is $10^{18}$-$10^{20}$ cm$^{-3}$, and the buried ground layer is N-type doped for NMOS and P-type doped for PMOS.

4. The method of a claim 1, wherein at step (d), the mask layer comprises a material selected from a group consisting of $SiO_2$, $Si_3N_4$ and $SiO_xN_y$, or combinations thereof.

5. The method of claim 1, wherein step (f) further comprises doping the contact plug, and the doping method comprises in-situ doping at the epitaxial process or ion implantation.

6. The method of claim 5, wherein at step (f), a doping concentration of the contact plug is $10^{18}$-$10^{20}$ cm$^{-3}$, and the contact plug is N-type doped for NMOS and P-type doped for PMOS.

7. The method of claim 1, wherein at step (f), a doping concentration of the contact plug is $10^{18}$-$10^{20}$ cm$^{-3}$, and the contact plug is N-type doped for NMOS and P-type doped for PMOS.

8. The method of claim 1, wherein at step (f), the material of the contact plug is Si, Ge, SiGe or SiC.

* * * * *